US006669803B1

United States Patent
Kathman et al.

(10) Patent No.: US 6,669,803 B1
(45) Date of Patent: Dec. 30, 2003

(54) SIMULTANEOUS PROVISION OF CONTROLLED HEIGHT BONDING MATERIAL AT A WAFER LEVEL AND ASSOCIATED STRUCTURES

(75) Inventors: Alan D. Kathman, Charlotte, NC (US); Harris R. Miller, Charlotte, NC (US); Jay Matthews, Huntersville, NC (US); Stacey Grabiner, Charlotte, NC (US); Waddie Heyward, Charlotte, NC (US)

(73) Assignee: Digital Optics Corp., Charlotte, NC (US)

( * ) Notice: Subject to any disclaimer, the term of this patent is extended or adjusted under 35 U.S.C. 154(b) by 265 days.

(21) Appl. No.: 09/672,445

(22) Filed: Sep. 29, 2000

Related U.S. Application Data

(63) Continuation-in-part of application No. 09/514,252, filed on Feb. 28, 2000, now Pat. No. 6,406,583, which is a continuation of application No. 08/943,274, filed on Oct. 3, 1997, now Pat. No. 6,096,155.

(51) Int. Cl.[7] .......................... B32B 31/18; H01L 21/78; G11B 7/00
(52) U.S. Cl. .................. 156/250; 156/291; 156/297; 156/299; 156/300; 216/24; 216/26
(58) Field of Search ................. 156/250, 299, 156/300, 560, 265, 291, 297; 438/460; 359/619, 642, 664; 369/112, 44.12, 103, 109; 257/98; 385/91, 89, 88, 37, 14; 216/2, 12, 24, 26

(56) References Cited

U.S. PATENT DOCUMENTS

| | | | |
|---|---|---|---|
| 3,579,816 A | 5/1971 | Ingraham | |
| 3,674,004 A | 7/1972 | Grandia et al. | |
| 3,691,707 A | 9/1972 | Von Arx et al. | |
| 3,698,080 A | 10/1972 | Berner | |
| 4,523,102 A | 6/1985 | Kazufumi et al. | |
| 4,769,108 A | 9/1988 | Deppe et al. | |
| 5,034,083 A | 7/1991 | Campanelli et al. | |
| 5,049,434 A * | 9/1991 | Wasulko | 156/230 |
| 5,058,997 A * | 10/1991 | Dickerson et al. | 349/105 |
| 5,157,001 A | 10/1992 | Sakuma | |
| 5,182,055 A | 1/1993 | Allison et al. | |
| 5,214,535 A * | 5/1993 | Harris et al. | 264/1.6 |
| 5,482,899 A * | 1/1996 | McKenna et al. | 156/344 |
| 5,500,869 A | 3/1996 | Yoshida et al. | |
| 5,680,702 A * | 10/1997 | Kataoka | 29/416 |
| 5,886,971 A | 3/1999 | Fedlman et al. | |
| 6,030,711 A * | 2/2000 | Evers | 174/259 |
| 6,030,857 A * | 2/2000 | Wensel | 438/118 |
| 6,096,156 A * | 8/2000 | Harden et al. | 156/250 |
| 6,235,141 B1 * | 5/2001 | Feldman et al. | 156/250 |

FOREIGN PATENT DOCUMENTS

| | | |
|---|---|---|
| EP | 0 731 417 A | 9/1996 |
| WO | WO 99/18612 | 4/1999 |

* cited by examiner

*Primary Examiner*—Richard Crispino
*Assistant Examiner*—Cheryl N. Hawkins
(74) *Attorney, Agent, or Firm*—Susan S. Morse

(57) ABSTRACT

Different techniques may be used to realize the simultaneous provision of bonding material at a controlled height on a wafer level. These techniques include photolithographically patterning a layer of bonding material and providing spacer elements on a wafer then contacting another surface having the bonding material provided thereon to transfer the bonding material to the spacer elements. The patterning of the bonding material may include using a mask direct contact with or spaced from the bonding material. The providing of the spacer elements may include forming the spacers in the wafer itself or attaching spacer elements, particularly a wafer of spacer elements. The resultant integrated structure has controlled spacing between the bonded elements.

27 Claims, 4 Drawing Sheets

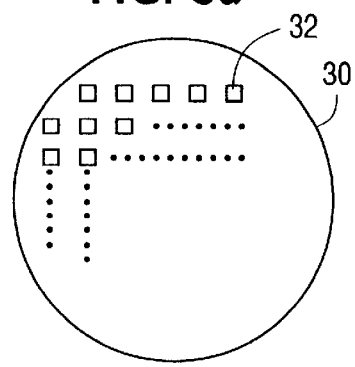
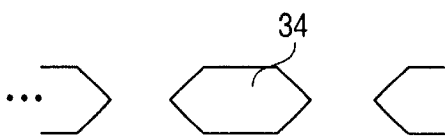
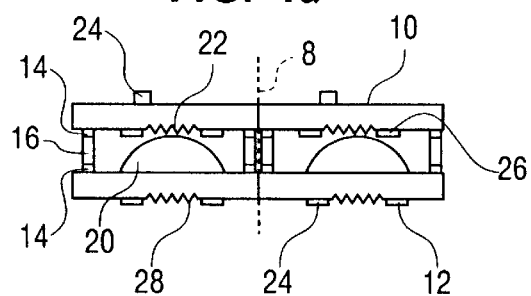
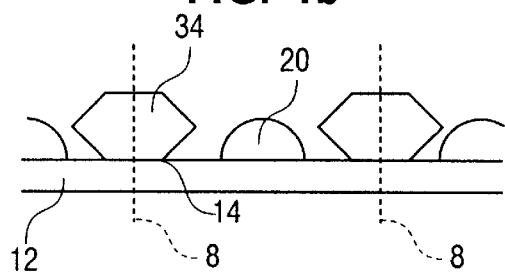
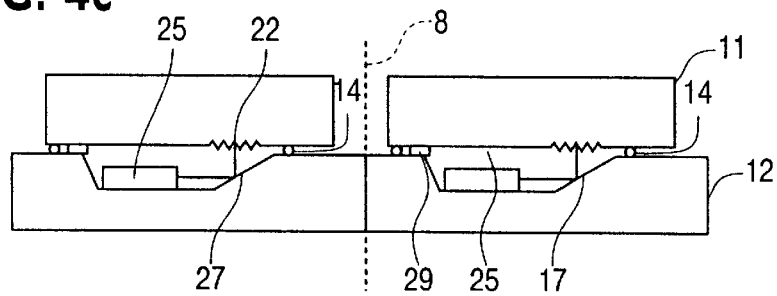

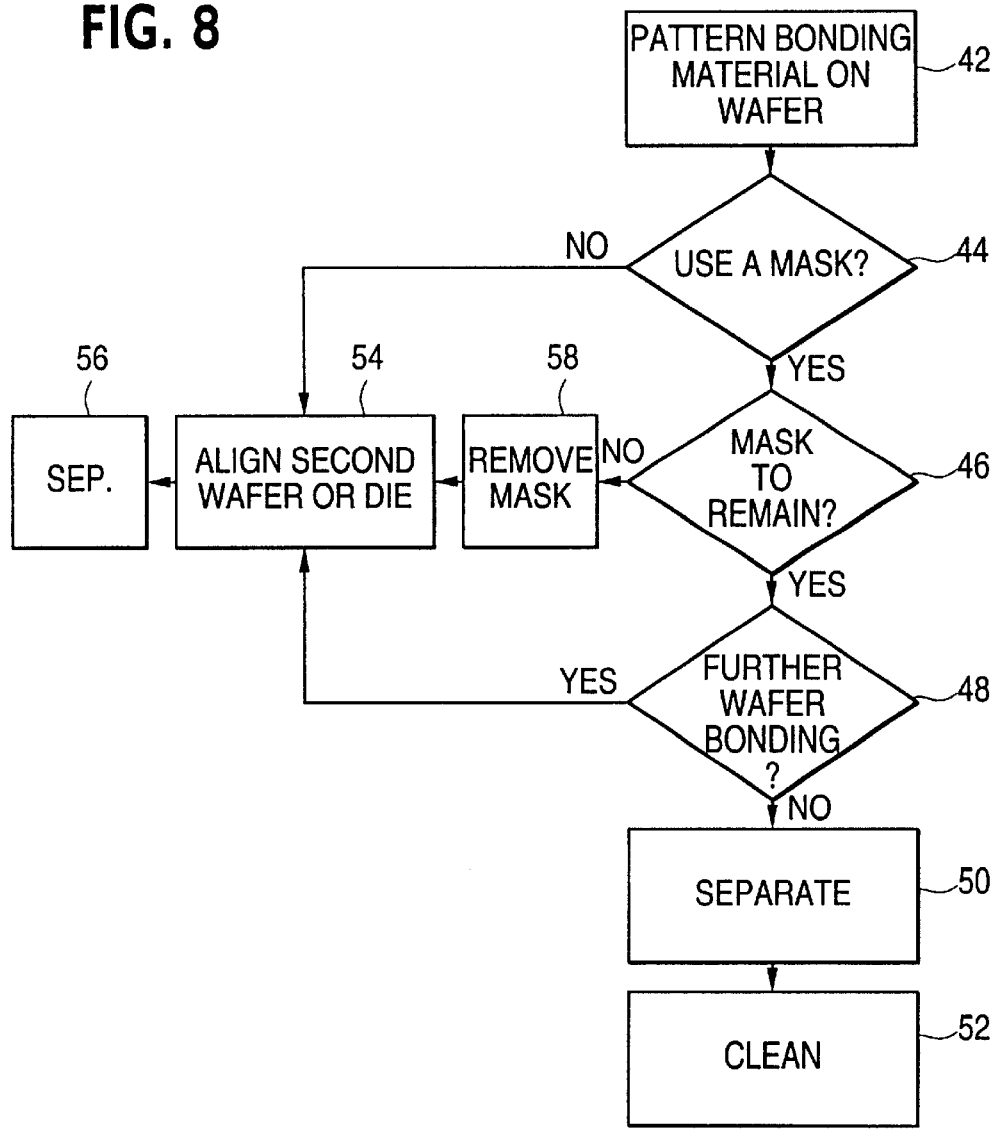

SIMULTANEOUS PROVISION OF CONTROLLED HEIGHT BONDING MATERIAL AT A WAFER LEVEL AND ASSOCIATED STRUCTURES

CROSS REFERENCES TO RELATED APPLICATIONS

This application is a continuation-in-part of U.S. application Ser. No.: 09/514,252, filed Feb. 28, 2000 now U.S. Pat. No. 6,406,583, entitled "Wafer Level Integration of Multiple Optical Elements", which is a continuation of U.S. application Ser. No.: 08/943,274, filed Oct. 3, 1997, now U.S. Pat. No. 6,096,155, entitled "Wafer Level Integration of Multiple Optical Elements", both of which are hereby incorporated by reference in their entirety for all purposes.

STATEMENT OF GOVERNMENT RIGHTS

The U.S. Government may have rights in this application pursuant to contract 70NANB8H4020 under the Advanced Technology Program with the National Institute of Standards and Technology of the U.S. Department of Commerce.

FIELD OF THE INVENTION

The present invention is directed to creating optical systems on a wafer level, including bonding at least two dies together. In particular, the present invention is directed efficient creation of optical systems, particularly the efficient provision of bonding material of a controlled height, the final individual module having at least two bonded dies.

BACKGROUND OF THE INVENTION

As the demand for smaller optical components to be used in a wider variety of applications increases, the ability to efficiently produce such optical elements also increases. In forming optical elements at a mass production level, the need for accurate alignment increases. Such alignment is even more critical when integrating more than one optical element. As used herein, optical elements is to include passive optical elements, such as diffractive lenses, refractive lenses, beam splitters, rotators, mirrors, i.e., elements which affect light incident thereon, as well as active optical elements, which create light or which have physical characteristics thereof modified in response to light.

To achieve greater alignment tolerances, passive alignment techniques have been used as set forth in U.S. Pat. No. 5,638,469 to Feldman entitled "Microelectronic Module Having Optical and Electrical Interconnects". One such passive alignment technique is to place metal pads on the optics and on the laser and place solder between them and use self-alignment properties to achieve the alignment. When solder reflows, surface tension therein causes the parts to self-align. However, passive alignment has not been employed for wafer-to-wafer alignment. In particular, the high density of solder bumps required and the thickness and mass of the wafer make such alignment impractical.

Another problem in wafer level production of optical elements including bonding at least two wafers arises due to the dicing process for forming the individual integrated elements. The dicing process is messy due to the use of a dicing slurry. When single wafers are diced, the surfaces thereof may be cleaned to remove the dicing slurry. However, when the wafers are bonded together, the slurry enters the gap between the wafers. Removing the slurry from the gap formed between the wafers is quite difficult.

Passive optical elements themselves may be formed photolithographically, as set forth, for example, in U.S. Pat. No. 5,218,471 to Swanson et al. entitled "High-efficiency, Multilevel, Diffractive Optical Elements". The passive optical elements may also be formed by injection molding, as set forth, for example, in U.S. Pat. No. 5,728,324 to Welch et al. entitled "Molding Diffractive Optical Elements". Further, the passive optical elements may be made by replicating on a wafer level, as set forth, for example, in U.S. Pat. No. 6,027,595 to Suleski et al. entitled "Method of Making Optical Replicas by Stamping in Photoresist and Replicas Made Thereby". More expensive passive optical elements, such as etalons, and many active optical elements, are more typically diced prior to integration, although some active optical elements, such as the power monitor disclosed in commonly assigned co-pending U.S. patent application Ser. No. 09/548,018 to Morris et al., entitled "Transmission Detection for Vertical Cavity Surface Emitting Laser Power Monitor and System", may also be formed and bonded on the wafer level.

SUMMARY OF THE INVENTION

Considering the foregoing background, it is an object of the present invention to efficiently produce optical elements including bonding of at least two dies. In accordance with the present invention, this may be realized by simultaneously providing bonding material.

These and other objects of the present invention will become more readily apparent from the detailed description given hereinafter. However, it should be understood that the detailed description gives specific examples, while indicating the preferred embodiments of the present invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 3*a* is a top view of a spacer wafer of the present invention;

FIG. 3*b* is a sample cross-section of the spacer wafer of FIG. 3*a*;

FIGS. 4*a*–4*c* illustrate specific examples of creating two bonded dies;

FIG. 8 is a flow chart of the bonding process of the present invention;

DETAILED DESCRIPTION OF THE PREFERRED EMBODIMENTS

Figure 1A:
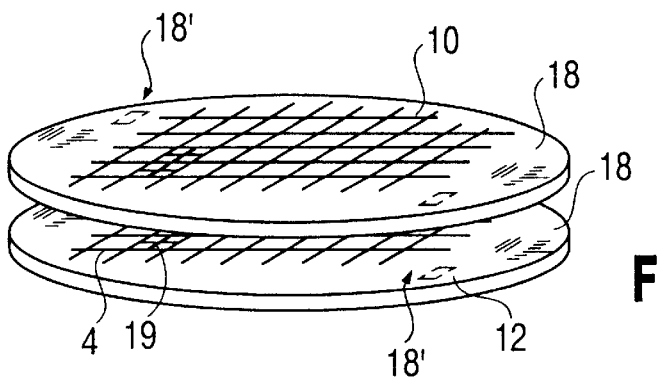
FIG. 1*a* is a perspective view illustrating wafers to be bonded.

As can be seen in FIG. 1a, a first substrate wafer 10 and a second substrate wafer 12 are to be bonded together in order to provide integrated optical module. A wafer is a disc, typically four, six, eight, or twelve inches in diameter and typically having a thickness between 400 microns and 6 mm, and typically made of Si, $SiO_2$, GaAs, or any other semiconductor material capable of modulating electromagnetic radiation. At least one of these wafers has an array of respective optical elements 19 formed thereon on either one or both surfaces thereof. The individual optical elements 19 to be integrated may consist of one or more optical elements. Further, the optical elements on the wafers may be identical, or may differ from one another. Advantageously, both substrates 10 and 12 include fiducial marks 18 somewhere thereon, most likely at an outer edge thereof, to ensure alignment of the wafers so that all the individual elements thereon are aligned simultaneously. Alternatively, the fiducial marks 18 may be used to create mechanical alignment features 18' on the wafers 11, 12. One or both fiducial marks 18 and the alignment features 18' may be used to align the wafers.

Figure 1B:
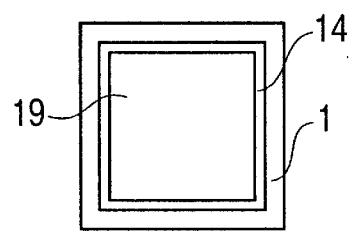
FIG. 1*b* is a top view illustrating an individual die on a wafer to be bonded.

FIG. 1b shows a top view of a die 1 to be bonded including the location of surrounding bonding material 14 for a particular element 19. The bonding material 14 is placed at strategic locations on either substrate in order to facilitate the attachment thereof. As can be seen from this top view, the bonding material 14 is to completely surround the individual optical element 19. By surrounding the optical elements which are to form the final integrated die, the bonding material 14 forms a seal between the wafers at these critical junctions. During dicing, the seal prevents dicing slurry and any other dicing by-products, from entering between the elements, which would result in contamination thereof. Since when bonded on a wafer level, the elements remain bonded together, it is nearly impossible to remove any contaminants trapped there between. The dicing contaminants present even more problems when diffractive elements are being created, since the structures of diffractive elements tend to trap the slurry.

Preferably, an adhesive or solder can be used as the bonding material 14. Solder is preferable in many applications because it is smoother than adhesives and allows easier movement prior to bonding. Adhesives have the advantages of being less expensive for a number of applications, they can be bonded with or without heating, they do not suffer with oxidation, and they can be transparent.

When using a fluid adhesive as the bonding material, the viscosity of the fluid adhesive is important. Viscosity directly impacts bond thickness, strength, and continuity. Different specific applications will require different bond properties and therefore specific adhesive viscosity.

It is difficult to control the height of the adhesive when the adhesive is applied using a mechanical process, e.g., ejection from a nozzle. This lack of control results in the amount of adhesive being overcompensated and the height of the adhesive, and hence[]the separation between the wafers, often being greater than desired. The difficulty controlling the height of the adhesive also results in air being trapped within the space containing the optical elements. This arises from the uncertainty as to the height and the timing of when a vacuum is pulled on the wafer pair. This air is undesirable, as it may expand upon heating and disrupt the bond of the elements. Further, the mechanical process is sequential and requires constant control of the delivery mechanism.

Figure 2A:
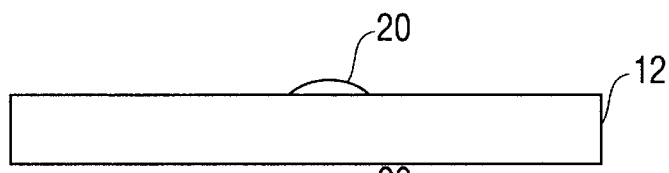
FIGS. 2*a*–2*d* illustrate a cross section for patterning a bonding material on a wafer.
Figure 2B:
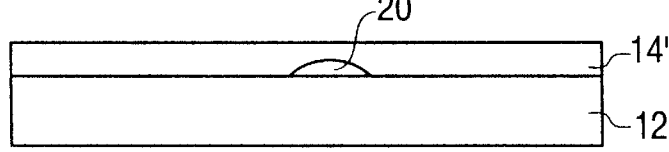

FIGS. 2a–2d illustrate an embodiment for allowing accurate control of the height of the bonding material 14. Only an individual optical element is shown, although the creation occurs on a wafer level. As shown in FIG. 2a, a refractive element 20 is formed on the wafer 12 on the wafer level. In FIG. 2b, the refractive element 20 and the regions adjacent thereto are covered by a bonding material layer 14'. Preferably, the bonding material layer 14' covers the entire surface of the wafer 12. The bonding material layer 14' may be uniformly created using known techniques, e.g., spinning, spraying, dipping or any other methods for uniformly applying the bonding material.

Figure 2C:
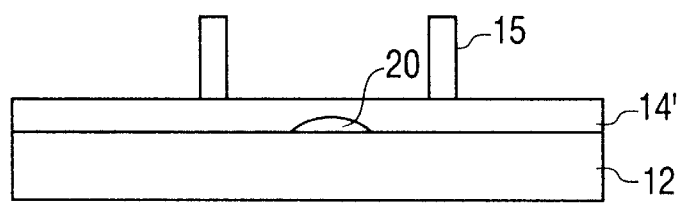
Figure 2D:
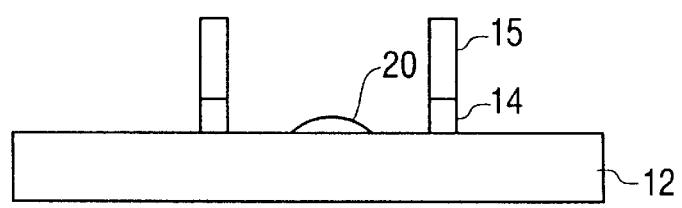

As shown in FIG. 2c, spacers 15 are then provided on the bonding material layer 14' at appropriate portions outside the path of the optical elements 20. The bonding material layer 14' is then cured. This structure in FIG. 2c is then subjected to an etching process, e.g., dry or wet etching, to remove the excess bonding material from the areas not covered by the spacers 15, resulting in the structure shown in FIG. 2d. The spacers 15 may then be removed, or may remain to provide a desired gap between the wafer 12 and a wafer to be stacked thereon. If the spacer 15 remains thereon, at least one of the other wafer and a top surface to of the spacer 15 is provided with a bonding material. If the spacer 15 is not to remain thereon, but only serves as a mask, the bonding material may only be partially cured, the pattern formed by the spacer 15 removed and then the bonding material brought into contact with the other piece to be bonded thereto. The bonding material would then be fully cured to bond the piece to be integrated.

The bonding material used in the creation shown in FIGS. 2a–2d is preferably a UV curable adhesive such as polyurethane, epoxy, polyester or acrylic resins. One preferred embodiment uses Norland Optical Adhesive No. 73. The spacers 15 are preferably also formed on a wafer level and preferably surround respective optical elements. In addition to spacers, the elements used to pattern the bonding material layer may also serve as mechanical structures for facilitating passive alignment with other dies.

Alternatively, the spacers 15 and the UV curable adhesive layer can be replaced by uniformly applying a mixture of a UV curable resin, such as a bisphenol A novolac glycidyl ether polymer resin and a photoacid generator such as triarylsulfonium salt. This mixture is commercially available from Microchem Corporation under the label SU-8. The bonding material layer containing the novolac glycidyl ether and triarylsulfonium salt may be uniformly created using known techniques, e.g., spinning, spraying, dipping or any other methods for uniformly applying the bonding material. The SU-8 material is exposed by a mask, which serves to cure the exposed regions photolithographically. The unexposed regions are removed by wet etchingusing solvents such as PGMEA (propylene glycol n) monomethyl ether acetate, a.k.a. 1-methoxy-2-proponal).

An example of a wafer of spacers is shown in FIG. 3a. A wafer 30 includes a plurality of holes 32 therein. Since the wafer 30 is to serve as a mask for the bonding material, the holes 32 are preferably through holes. These holes 32 are to be aligned over the optical elements on the other wafer being processed.

One way to form a wafer of spacers is to etch, either wet or dry, a silicon wafer. When a silicon wafer is etched with potassium hydroxide, etching occurs very quickly along the 0,0,1 plane, and very slowly along the 1,1,1 plane of the silicon. Etching both sides of the wafer for the same time to etch halfway through either surface results in the cross section shown in FIG. 3b. This particular etching results in spacing elements having in a 54° angled surface where etched. Creation of holes in a wafer allows the thickness of the spacers to be easily controlled.

The wafer shown in FIG. 3a may also be used to provide bonding material on top of spacers on the wafer being processed or even directly on the wafer being processed itself. For this application, the holes do not have to go all the way through the wafer 30, but only have to be deep enough so that any bonding material applied thereto will not be transferred to the receiving surface. The bonding material may be uniformly provided on the wafer 30 as discussed above. The wafer 30 having the bonding material thereon is then brought into contact with the receiving surface and then the wafer 30 is removed. The object to be bonded to the receiving surface is then positioned and the bonding material is cured. This technique is particularly useful for providing bonding material on top of spacers, on surfaces receiving dies rather than wafers, and on wafers in which all of the elements are not in the same plane.

When bonding two wafers both having continuous surfaces together or when bonding prior to dicing results in a structure which is difficult to clean, the bonding material preferably completely seals each element to be individually utilized. Thus, when dicing a wafer in order to perform the individual elements, dicing slurry used in the dicing process is prevented from contaminating the optical elements. Thus, in addition to providing a structural component to maintain alignment and rigidity during dicing, the bonding material seal also makes the dicing a much cleaner process for the resultant integrated dies. However, when bonding and dicing a wafer of through holes, such as shown in FIG. 3b, and a continuous wafer, this seal does not have to be formed, since dicing slurry will enter through the holes and the wafer being processed can be cleaned through the hole before further processing.

A specific example of integrated multiple optical elements is shown in FIG. 4a. A refractive 20 is formed on a surface of the first substrate 12. A diffractive 22 is formed on a surface of the other substrate 10. A diffractive 28 may also be formed on a bottom surface of either substrate. The spacers 15 have bonding material 14 provided on the top and bottom thereof.

In addition to using the fiducial marks 18 shown in FIG. 1a for alignment of the substrates 10, 12, the fiducial marks 18 may also be used to provide metalized pads 24 as shown in FIG. 4a on opposite sides of the substrates rather than their bonding surfaces in order to facilitate alignment and insertion of the integrated multiple optical element into its intended end use. Such metal pads are particularly useful for mating the integrated multiple optical elements with an active or electrical element, such as in a laser for use in an optical head, a laser pointer, a detector, etc. Further, for blocking light, metal 26 may be placed on the same surface as the diffractive 22 itself using the fiducial marks 18, also as shown in FIG. 4a.

FIG. 4b illustrates another example of integrated optical module. A refractive 20 is formed on a surface of the first substrate 12. Here, a laser 25 is provided in a bench 17 in the wafer 12. This bench may be formed by etching silicon. A reflective surface 27 is also provided to redirect the light from the laser 25. A die 11 containing a diffractive element 22 is bonded to the wafer 12 via the bonding material 14. In FIG. 4b, the bonding occurs prior to dicing. Alternatively, the bonding material may be provided, the wafer 12 diced, and then the die 11 bonded thereto.

FIG. 4c illustrates another example of an integrated optical module. As shown therein, a wafer 12 having refractives 20 formed thereon and the wafer 30 are bonded together using bonding material 14. The bonded pair may be diced through the spacing portions 34 to form a refractive 20 with spacers thereon. The refractive 20 is cleaned after dicing.

Additionally, when using photolithographic techniques, the mask does not have to be placed in direct contact with the adhesive material. This is particularly useful when employing an adhesive which has more than one curing mechanism, e.g., thermoset epoxies such as Norland 73 and Masterbond UC 15. A mask may be placed in proximity with the adhesive on a wafer and exposed to UV radiation. The exposed adhesive is then developed with a solvent to remove unwanted portions. Another die/wafer is then aligned with the wafer having the patterned adhesive thereon. The pair is then placed in contact and baked to bond the wafer and the wafer die by thermally cross-linking the adhesive.

Figure 5A:
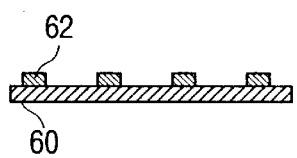
FIGS. 5*a*–5*c* illustrate a method for providing adhesive to a wafer having a plurality of spacers formed thereon and bonding another wafer thereto.
Figure 5B:
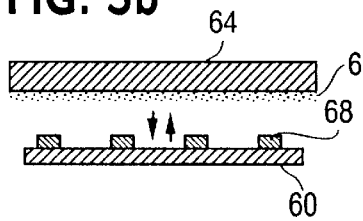
Figure 5C:
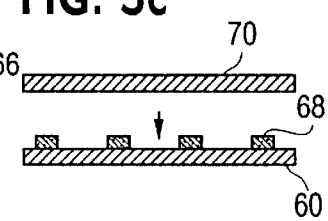

As an alternative to direct patterning of the adhesive, a wafer with an array of spacers formed on the wafer or attached thereto may be contacted with another wafer serving as a transfer wafer having a uniform layer of adhesive thereon. This contact will leave the adhesive on the spacers for facilitating further bonding to a die/wafer. Two examples of this are shown in FIGS. 5a–5c and 6a–6c. As can be seen in FIGS. 5a–5c, a wafer 60 has a plurality of spacers 63 formed thereon. These spacers may be made of polymer and formed photolithographically on the wafer level. A transfer wafer 64 having a uniform layer of bonding material 66 is then brought into contact with the wafer 60. Upon removing the transfer wafer 64, the remaining bonding material 68 will then be on the top of the spacers 62. Since the spacers 62 determine where the bonding material will be deposited, the alignment of the wafer 60 and the transfer wafer 64 is not critical. The degree to which the bonding material extends down the side of the spacers 62 will depend on the viscosity of the bonding material and is not of particular importance. The two wafers are just raised and lowered relative to one another, without any particular pressure control, as if they were being brought into contact for bonding themselves. The amount of bonding material being transferred depending upon the viscosity of the bonding material, the thickness of the bonding material and the materials of the wafers. A second wafer 70 may then be aligned and bonded to the wafer 64.

Figure 6A:
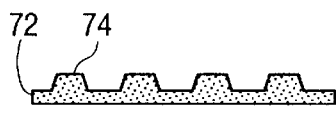
FIGS. 6*a*–6*c* illustrate a method for providing adhesive to a wafer having a plurality of spacers formed therein and bonding another wafer thereto.
Figure 6B:
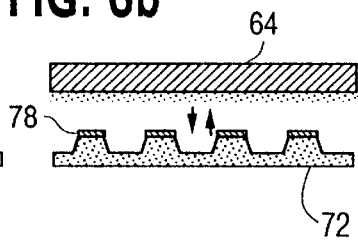
Figure 6C:
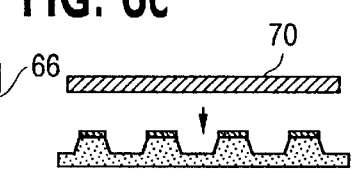

FIGS. 6a–6c illustrate a similar method, except here the spacers 74 are formed in the wafer 72 itself, e.g., by etching the wafer 72. Again, the transfer wafer 64 having the uniform layer of bond material 66 is brought into contact with and removed from the wafer 72, leaving bonding material 78 on top of the spacers 74. The second wafer 70 may then be aligned and bonded with the wafer 72.

Figure 7A:
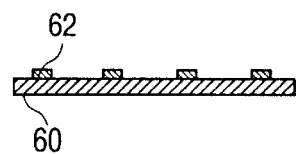
FIGS. 7*a*–7*e* illustrate a method for providing adhesive to a plurality of dies having spacers thereon and bonding these dies to another wafer or die.
Figure 7B:
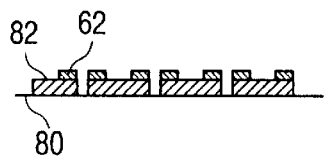
Figure 7C:
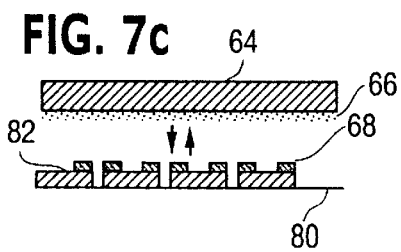
Figure 7D:
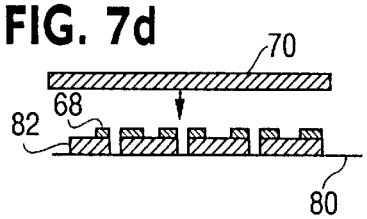
Figure 7E:
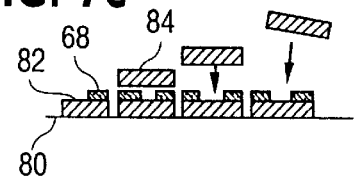

While the term "wafer" has been used in the above examples to indicate an undiced wafer, it is to be understood that the above techniques are applicable to any configuration having an arrangement allowing simultaneous processing. FIGS. 7a–7e illustrate a specific example of an alternative to the method of providing the adhesive on a true wafer level. Again, the wafer 60 has a plurality of spacers 62 thereon. This wafer 60 is then diced, typically such that each die 82 contains a spacer 62. The dicing of a wafer typically involves the used of a dicing tape 80. Thus, the dies 82 remaining of the dicing tape 80 may still be simultaneously processed. As shown in FIG. 7c, the transfer wafer 64 having the uniform layer of bonding material 66 thereon may be brought into contact with and removed from the spacers simultaneously, leaving bonding material 68 thereon. Thus, while the wafer 60 has been diced into a plurality of dies 82, these dies may still be processed at the same time. Then, the other wafer 70 may be aligned and bonded with the plurality of dies 82. The dicing tape 80 is then removed and the bonded structure diced to form the bonded die pair. Alternatively, as shown in FIG. 7e, individual dies 84 may be aligned with the dies 80 using conventional pick and place techniques and bonded thereto. These die pairs are then simply removed from the dicing tape 80. The latter method is particularly useful when the dies to be bonded are of different sizes, with the larger dies being on the dicing tape.

Thus, in the general flow chart discussed below, the final production of the die pair is generically referred to as "separating." While the "separating" will typically be dicing, when the above dicing tape configuration is employed, this separating may include only removing the die pair from the dicing tape.

FIG. 8 shows a flow chart of the general process of bonding in accordance with the present invention. In step 42, bonding material is patterned on a wafer, either diced or undiced, simultaneously. The patterning may be using a mask, stamping from a spacer wafer, stamping from a transfer wafer, or any of the other techniques used above. If a mask is used, step 44 proceeds to step 46 to determine if the mask is to remain. If the mask remains, whether there is to be further wafer level bonding is determined in step 48. If not, the die pairs are separated from one another in step 50, and then cleaned in step 52. If a mask is not used, step 44 proceeds to step 54, at which a second wafer or a die is aligned to the wafer. The bonding material is cured and the die pairs are separated from one another in step 56. If a mask is used, but is not to remain on the wafer, step 46 proceeds to step 58, at which the mask is removed. Then, a second wafer or a die is aligned to the wafer. The bonding material is cured and the die pairs are separated in step 56. If the mask remains and there is to be further wafer bonding, the step 48 proceeds to step 54, at which a second wafer or a die is aligned to the wafer. The bonding material is cured and the die pairs are separated in step 56.

The elements to be bonded together are preferably created by direct photolithographic techniques, as set forth, for example, in U.S. Pat. No. 5,161,059 to Swanson, which is hereby incorporated by reference, for the diffractive optical elements, or in creating the spherical refractive elements by melting a photoresist as taught in O. Wada, "Ion-Beam Etching of InP and its Application to the Fabrication of High Radiance InGAsP/InP Light Emitting Diodes," General Electric Chemical Society, Solid State Science and Technology, Vol. 131, No. 10, October 1984, pages 2373–2380, or making refractive elements of any shape employing photolithographic techniques used for making Diffractive optical elements when the masks used therein are gray scale masks such as high energy beam sensitive (HEBS) or absorptive gray scale masks, disclosed in allowed U.S. application Ser. No.: 09/044,864, filed on Mar. 20, 1998 to Feldman et al. entitled "Fabricating Optical Elements Using a Photoresist Formed From Contact Printing of a Gray Level Mask", which is hereby incorporated by reference in its entirety for all purposes. Alternatively, these photolithographic techniques may be used to make a master element in glass which in turn may then be used to stamp out the desired element on a wafer level in a layer of embossable material as set forth in previously cited U.S. Pat. No. 6,027,595 to Suleski et al. entitled "Method of Making Optical Replicas by Stamping in Photoresist and Replicas Made Thereby".

The invention being thus described, it would be obvious that the same may be varied in many ways. Such variations are not regarded as a departure from the spirit and scope of the invention, and such modifications as would be obvious to one skilled in the art are intended to be included within the scope of the following claims.

What is claimed is:

1. A method for forming an optical module having at least two dies comprising:
   providing a layer of bonding material on a wafer and contacting a plurality of first dies and the wafer;
   aligning a plurality of second dies with the plurality of first dies to form a plurality of first die—second die pairs;
   treating the bonding material to bond the first die—second die pairs; and
   separating the bonded first die—second die pairs, each resulting bonded first die—second die pair each containing at least one optical element.

2. The method as recited in claim 1, wherein the wafer is removed prior to said aligning.

3. The method as recited in claim 1, wherein the wafer has a plurality of protrusions corresponding to regions on which the bonding material is to remain on the plurality of first dies.

4. The method as recited in claim 3, wherein the plurality of protrusions on the wafer is formed by etching holes in the wafer.

5. The method of claim 4, wherein said etching includes etching a same amount from either surface of the wafer.

6. A method for forming an optical module having at last two dies comprising:
   simultaneously patterning a bonding material over a plurality of first dies;
   aligning a plurality of second dies with the plurality of first dies to form a plurality of first die—second die pairs;
   treating the bonding material to bond the first die—second die pairs; and
   separating the bonded first die—second die pairs, each resulting bonded first die—second die pair each containing at least one optical element, wherein each die of the plurality of the first dies has a spacer and said simultaneously patterning includes contacting a transfer wafer having a uniform layer of bonding material thereon with the plurality of first dies and removing the transfer layer, thereby leaving bonding material on the spacers.

7. The method as recited in claim 6, wherein at least one of the plurality of first dies and the plurality of second dies are integrated on a wafer.

8. The method as recited in claim 6, wherein each of the first and second pluralities of dies are integrated on first and second wafers and said aligning step includes aligning fiducial features on each of the first and second wafers to one another.

9. The method as recited in claim 6, wherein the bonding material is a curable epoxy.

10. The method as recited in claim 6, wherein said patterning includes leaving bonding material surrounding each optical element such that each resulting die pair is protected during said separating by the bonding material.

11. The method of claim 7, wherein said separating includes dicing.

12. The method of claim 6, wherein said separating includes removing die pairs from a common holding structure holding the plurality of first dies.

13. The method of claim 12, wherein the common holding structure is dicing tape.

14. A method for forming an optical module having at least two dies comprising:

simultaneously patterning a bonding material over a plurality of first dies, said simultaneously patterning including providing an adhesive layer as the bonding materal on the plurality of first dies and lithographically patterning using a mask in contact with the adhesive layer;

aligning a plurality of second dies with the plurality of first dies to form a plurality of first die—second die pairs;

treating the bonding material to bond the first die—second die pairs, said treating occurring with the mask on the adhesive layer; and separating the bonded first die—second die pairs, each resulting bonded first die—second die pair each containing at least one optical element.

15. The method as recited in claim 14, further comprising providing additional bonding material on top of the mask.

16. The method as recited in claim 14, wherein the mask is the plurality of second dies.

17. The method as recited in claim 16, further comprising providing an additional die on the mask.

18. The method as recited in claim 17, wherein the mask is a plurality of spacers integrated on a second wafer.

19. The method as recited in claim 18, wherein the additional die is a plurality of dies integrated on a third wafer.

20. The method as recited in claim 16, wherein the mask is a plurality of spacers integrated on a second wafer.

21. The method of claim 20, wherein the plurality of spacers integrated on the second wafer is formed by etching holes in the second wafer.

22. The method of claim 21, wherein said etching includes etching a same amount from either surface of the second wafer.

23. The method as recited in claim 14, wherein said providing includes spinning a layer of the bonding material over the plurality of first dies.

24. The method as recited in claim 23, wherein said spinning creates a layer of the bonding material of an entire surface of the plurality of first dies including the array of optical elements.

25. A method for forming an optical module having at least two dies comprising:

simultaneously patterning a bonding material over a plurality of first dies, said simultaneously patterning including providing an adhesive layer as the bonding material on the plurality of first dies and lithographically patterning using a mask in contact with the adhesive layer, wherein the mask is a plurality of spacers integrated on a second wafer;

aligning a plurality of second dies with the plurality of first dies to form a plurality of first die—second die pairs;

treating the bonding material to bond the first die—second die pairs; and separating the bonded first die—second die pairs, each resulting bonded first die—second die pair each containing at least one optical element.

26. The method of claim 25, wherein the plurality of spacers integrated on the second wafer is formed by etching holes in the second wafer.

27. The method of claim 26, wherein said etching includes etching a same amount from either surface of the second wafer.

* * * * *

UNITED STATES PATENT AND TRADEMARK OFFICE
CERTIFICATE OF CORRECTION

PATENT NO.         : 6,669,803 B1
APPLICATION NO.    : 09/672445
DATED              : December 30, 2003
INVENTOR(S)        : Alan Kathman et al.

Page 1 of 1

It is certified that error appears in the above-identified patent and that said Letters Patent is hereby corrected as shown below:

In the Claims:

Column 8, lines 30-31:

"6. A method for forming an optical module having at last two dies comprising:"

should read:

-- 6. A method for forming an optical module having at least two dies comprising: --

Column 9, lines 5-10, claim 14:

"simultaneously patterning a bonding material over a plurality of first dies, said simultaneously patterning including providing an adhesive layer as the bonding materal on the plurality of first dies and lithographically patterning using a mask in contact with the adhesive layer;"

should read:

-- simultaneously patterning a bonding material over a plurality of first dies, said simultaneously patterning including providing an adhesive layer as the bonding material on the plurality of first dies and lithographically patterning using a mask in contact with the adhesive layer; --

Signed and Sealed this
Twenty-third Day of July, 2013

Teresa Stanek Rea
*Acting Director of the United States Patent and Trademark Office*